United States Patent
Han et al.

(10) Patent No.: US 7,135,760 B2
(45) Date of Patent: Nov. 14, 2006

(54) MOISTURE RESISTANT INTEGRATED CIRCUIT LEADFRAME PACKAGE

(75) Inventors: Byung Joon Han, Singapore (SG); Byung Hoon Ahn, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 261 days.

(21) Appl. No.: 10/446,275

(22) Filed: May 23, 2003

(65) Prior Publication Data

US 2004/0061205 A1 Apr. 1, 2004

Related U.S. Application Data

(60) Provisional application No. 60/415,227, filed on Sep. 30, 2002.

(51) Int. Cl.
*H01L 23/495* (2006.01)

(52) U.S. Cl. ............... 257/676; 257/669; 257/674

(58) Field of Classification Search .......... 257/666, 257/669, 670, 672, 696, 787, 788, 789, 790, 257/782, 784, 685, 686, 777, 778, 674, 676; 458/112, 118, 123, 124, 127

See application file for complete search history.

(56) References Cited

U.S. PATENT DOCUMENTS

| | | | | |
|---|---|---|---|---|
| 5,424,576 A | * | 6/1995 | Djennas et al. | 257/666 |
| 5,637,913 A | * | 6/1997 | Kajihara et al. | 257/666 |
| 5,639,989 A | * | 6/1997 | Higgins, III | 174/35 MS |
| 5,723,899 A | * | 3/1998 | Shin | 257/666 |
| 5,814,877 A | | 9/1998 | Diffenderfer et al. | 257/666 |
| 5,874,773 A | * | 2/1999 | Terada et al. | 257/676 |
| 6,008,073 A | * | 12/1999 | King et al. | 438/123 |
| 6,020,625 A | * | 2/2000 | Qin et al. | 257/666 |
| 6,437,427 B1 | * | 8/2002 | Choi | 257/666 |
| 2002/0024122 A1 | * | 2/2002 | Jung et al. | 257/666 |
| 2002/0084518 A1 | * | 7/2002 | Hasebe et al. | 257/676 |
| 2002/0140061 A1 | * | 10/2002 | Lee | 257/666 |

* cited by examiner

*Primary Examiner*—Hung Vu
(74) *Attorney, Agent, or Firm*—Mikio Ishimaru

(57) ABSTRACT

A leadframe for a semiconductor die includes signal leads, ground leads, and a die support holder for supporting the semiconductor die. The die support holder has opposite surfaces and side edges therebetween. The opposite die support holder surfaces are smaller in transverse extent than the semiconductor die for supporting the die on one of the opposite die support holder surfaces such that the die extends beyond the side edges of the die support holder.

18 Claims, 4 Drawing Sheets

MOISTURE RESISTANT INTEGRATED CIRCUIT LEADFRAME PACKAGE

CROSS-REFERENCE TO RELATED APPLICATION(S)

This application claims the benefit of U.S. Provisional Patent Application Ser. No. 60/415,227 filed Nov. 30, 2002, and the subject matter thereof is hereby incorporated herein by reference thereto.

The present application contains subject matter related to a co-pending U.S. Provisional Patent Application Ser. No. 60/415,330 filed Nov. 30, 2002, and the subject matter thereof is hereby incorporated herein by reference thereto.

The present application also contains subject matter related to a concurrently filed U.S. Patent Application by Byung Joon Han, Byung Hoon Ahn, and Zheng Zheng entitled "INTEGRATED CIRCUIT LEADFRAME WITH GROUND PLANE". This application is identified by Ser. No. 10/444,849, and the subject matter thereof is hereby incorporated herein by reference thereto. This related patent application is assigned to ST Assembly Test Services Ltd.

1. Technical Field

The present invention relates generally to integrated circuits, and more particularly to moisture resistant leadframe packages for integrated circuits.

2. Background Art

Reducing the size of electronic devices, while increasing performance and speed, has been a continuing objective in the electronics industry. Integrated circuit packages for complex electronic systems typically have a large number of interconnected integrated circuit chips. The integrated circuit chips are usually made from a semiconductor material such as silicon or gallium arsenide. The various semiconductor devices on the integrated circuit chips are formed in various layers on the chips using photolithographic techniques. After manufacture, the integrated circuit chips are typically incorporated into packages that are then mounted on printed circuit wiring boards.

Integrated circuit chip packages typically have numerous external pins that are mechanically attached by solder or a variety of other known techniques to conductor patterns on the printed circuit wiring boards.

Typically, the packages in which these integrated circuit semiconductor chips are mounted include a substrate or other chip mounting device. One example of such a substrate is a leadframe. High performance leadframes typically are multi-layer structures including power, ground, and signal layers on separate planes.

Leadframes also typically include an area on which a semiconductor integrated circuit chip is mounted and in which a number of power, ground, and/or signal leads is attached to the semiconductor integrated circuit chip. In particular, the power, ground, and/or signal leads of the leadframe are connected electrically to power, ground, and/or signal sites on the integrated circuit semiconductor chip.

Semiconductor integrated circuit chips may be attached to the leadframe using adhesive or any other appropriate techniques for attaching such chips to a leadframe. Techniques commonly known to those skilled in the art for attaching such chips to a leadframe, for example, include soldering.

Once the integrated circuit chip(s) are attached mechanically and electrically to the leadframe, the leadframe may be enclosed or encapsulated in a protective enclosure. Such enclosures may include encapsulation in a plastic or a multi-part housing made of plastic, ceramic, or metal. The enclosure may protect the leadframe and the attached chip from physical, electrical, moisture, and/or chemical damage.

The leadframe and attached chip(s) may then be mounted on, for example, a circuit board or card along with other leadframes or devices. The circuit board or card may then be incorporated into a wide variety of devices such as computers, cellular telephones, automobiles, appliances, and so forth.

Typical known leadframes that include a number of layers on different planes are complex and expensive to produce. Multiple planes have been incorporated into the design of many leadframes as a solution to accommodate the high density of leads needed for the highly complex integrated circuits typically used today.

In many such multiple plane designs, each plane typically has a single function, such as ground, power, or signal. The separation of the functions in the different planes is to help electrically isolate the various planes in order to reduce electrical interference, such as noise, from one plane to another.

Unfortunately, even when the layers are built up using known techniques, such multi-layer leadframes, although functionally effective, are very complex and often are not cost effective.

Another problem with these multi-layer leadframes is that the ground plane preferably must be in a different layer from the semiconductor chip mounting structure, such as a die support holder, for example, a die attach or mounting paddle. Single and double downsetting and upsetting methods have been developed to accomplish this. However, these methods cause mechanical stress on the ground plane and result in ground plane distortion or warp.

The ground plane distortion or warp prevents the ground plane from sitting flat on a wire bonding heater block and causes bouncing of the ground plane during the wire bonding process, resulting in poor ground bonding integrity.

Still another problem is insufficient resistance to the entrance of moisture into the sealed package, particularly when the die mounting paddle is left externally exposed to provide better heat dissipation. The resulting externally exposed interface or seam between the encapsulating body and the die mounting paddle can provide a pathway for the entrance of moisture into the package.

Solutions to problems of this sort have been long sought, but have long eluded those skilled in the art.

DISCLOSURE OF THE INVENTION

The present invention provides a leadframe for a semiconductor die. The leadframe includes signal leads, ground leads, and a die support holder for supporting the semiconductor die. The die support holder has opposite surfaces and side edges therebetween. The opposite die support holder surfaces are smaller in transverse extent than the semiconductor die for supporting the die on one of the opposite die support holder surfaces such that the die extends beyond the side edges of the die support holder. This results in substantially improved moisture penetration resistance when the leadframe and die are encapsulated into a semiconductor package.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
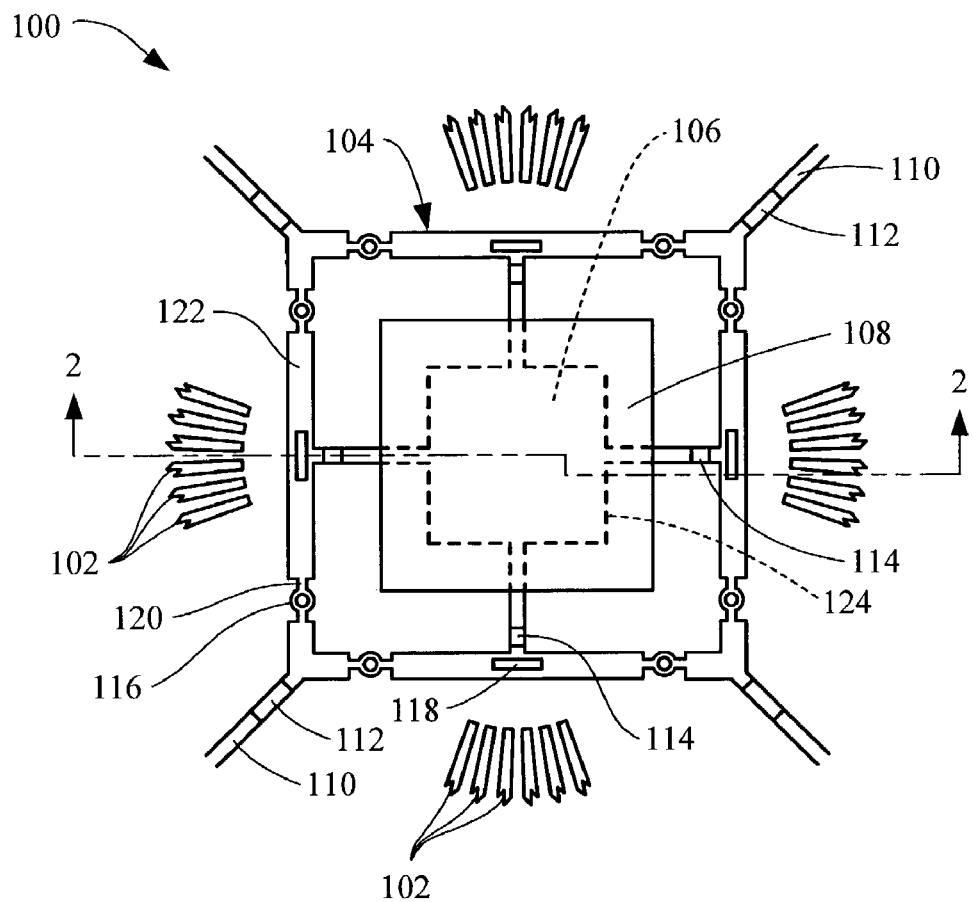
FIG. 1 is a plan view of a leadframe for an integrated circuit incorporating moisture ingress resistance features according to the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs.

The term "horizontal" as used herein is defined as a plane parallel to the conventional plane or surface of the semiconductor die mounting paddle, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a plan view of a leadframe 100 for an integrated circuit. The leadframe 100 includes three principal layers on three different levels or planes. Initially formed from a single flat sheet of material, usually metal, these several functional layers are fabricated, preferably, in a single stamping, cutting, and forming process.

In the topmost layer or plane is located a number of signal leads 102. In the intermediate layer or plane is located a ground plane structure that, in the embodiment illustrated in FIG. 1, is a bonding ring 104.

In the lower or bottom layer or plane is located a die support holder such as a frame paddle 106 that serves as a mounting pad for a semiconductor device, such as a die 108, for mounting and supporting the die 108 on the leadframe 100.

The bonding ring 104 and the frame paddle 106 are supported from ground leads 110 that, at their distal extents, are in the same upper plane as the signal leads 102. Then, to reach the intermediate plane of the bonding ring 104, each ground lead 110 has a first downset 112 formed therein connecting to the bonding ring 104.

To connect the frame paddle 106 to the bonding ring 104, second downsets 114 are provided at several locations therebetween, as illustrated. Together, the downsets 112 and 114 form supports for the elements of the leadframe 100, supporting and holding them in their respective layers or planes. Similarly, the downsets and upsets described later herein serve as supports that hold the various leadframe elements in their respective layers or planes.

It has been discovered that the metal forming operation that bends and forms the first downsets 112 and the second downsets 114 causes mechanical stresses, particularly on the bonding ring 104, that leave residual distortions and warpage therein. In prior art devices, such residual stresses and distortions have led to poor ground bonding integrity when electrical connections were made between the semiconductor device, such as the die 108, and the bonding ring 104. For example, ground plane warpage interferes with achieving the proper physical contact between the ground plane bonding ring and a wire bonding heater block, causing bouncing during conventional wire bonding processes.

To overcome these prior art problems, the leadframe 100 incorporates force release and stress relief structures and features for the bonding ring 104. In particular, and as illustrated in FIG. 1, the bonding ring 104 includes a number of open rings 116 and slots 118 therein. These are located and distributed throughout the bonding ring 104 as appropriate for relieving residual stresses therein. For example, as shown in FIG. 1, each branch of the bonding ring 104 is separated by an open ring 116 from the first downset 112 connected thereto. Similarly, a slot 118 is provided in the bonding ring 104 at each location where a second downset 114 is attached thereto. Additionally, the open rings 116 are connected to the bonding ring 104 by necks 120.

Between the necks 120 and the slots 118 are the major extents 122 of the bonding ring 104. The major extents 122 are the portions of the bonding ring 104 to which ground wire connections from the die 108 to the bonding ring 104 are made, as further described below with respect to FIG. 2.

The open rings 116 and the necks 120 are much narrower in transverse material extent than the major extents 122 of the bonding ring 104. Similarly, the slots 118 cause the actual amount of transverse material at each slot to be greatly reduced. These regions of narrowed transverse material are much weaker, or less stiff, than the major extents 122 of the bonding ring 104, and therefore preferentially flex and yield, releasing and absorbing the residual stress forces in the bonding ring 104. They also help to prevent such forces from being transmitted to the major extents 122 during the metal forming operations for the leadframe 100. The result is a significant reduction in residual distortions in the major extents 122 of the bonding ring 104.

As can also be seen in FIG. 1, the frame paddle 106 is much smaller in transverse extent than the die 108, allowing the die to extend well beyond the side edges 124 of the frame paddle.

Figure 2:
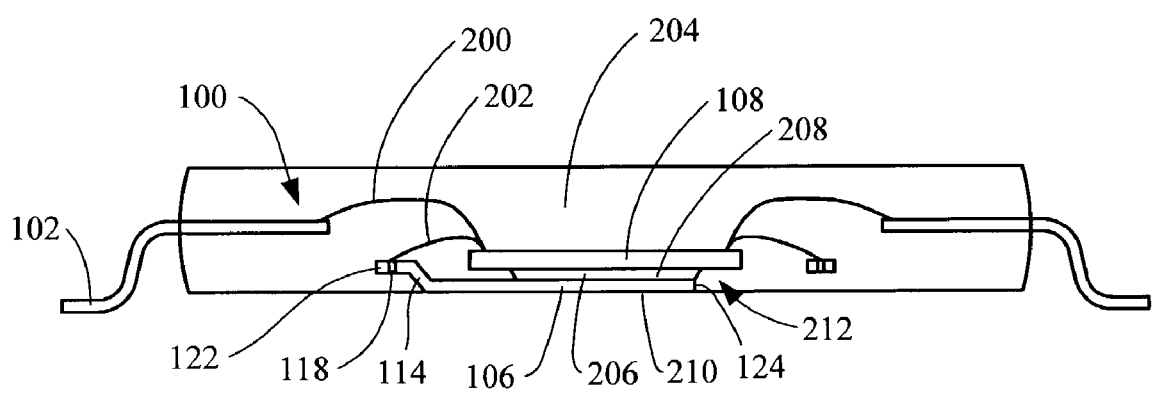
FIG. 2 is a cross-sectional view of the structure of FIG. 1 taken generally on line 2—2 of FIG. 1.

Referring now to FIG. 2, therein is shown a cross-sectional view of the structure of FIG. 1, taken generally on line 2—2 thereof. In addition, FIG. 2 illustrates the full extent of the signal leads 102, and shows the leadframe 100 in a final state of manufacture in which signal wires 200 have been bonded to the signal leads 102 and connected to the die 108, ground wires 202 have been bonded to the major extents 122 of the bonding ring 104 (FIG. 1) and connected to the die 108, and an encapsulating body 204, such as a molded resin, has been formed therearound. Also shown is an adhesive 206 that bonds the die 108 to the top surface 208 of the frame paddle 106. The encapsulating body 204 is formed in known fashion to leave the opposite, bottom surface 210 of the frame paddle 106 unencapsulated, or fully exposed externally, to facilitate dissipation of heat from the die 108.

As can be seen in FIG. 2, the "undercut" or shorter transverse extent of the frame paddle 106 relative to the die 108 creates a pocket 212 between the bottom edge regions of the die 108 and the side edges 124 of the frame paddle 106. The pocket 212, filled by the encapsulating body 204 material, presents a long path along the interface between the encapsulating body material in the pocket 212 and the adjacent side edges 124 of the frame paddle, the side edges of the adhesive 206, and the bottom surface and side edges of the die 108. As compared with prior art frame paddles that are generally co-extensive with the die that is supported thereon, the present invention presents a much longer path along the material interface around the edges of the pocket 212. This longer path substantially increases the resistance to moisture ingress, since the moisture must travel many times farther than in prior art devices to reach the upper or top surface of the die 108. Damaging moisture penetration is therefore substantially reduced by the present invention.

Figure 3:
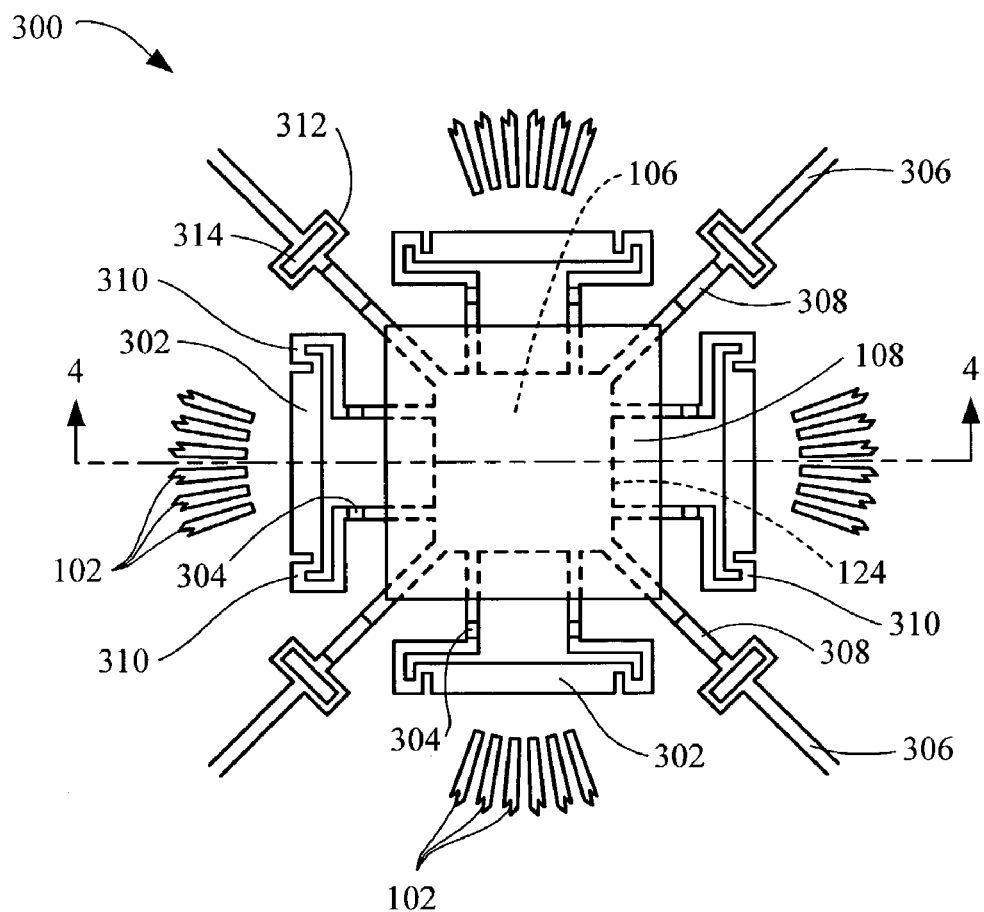
FIG. 3 is a plan view of another leadframe configuration incorporating moisture ingress resistance features in accordance with the present invention.

Referring now to FIG. 3, therein is shown a leadframe 300 that incorporates alternative force release and stress relief structures. For clarity and ease of illustration and description of this and other embodiments disclosed herein, like features one to another are described with like reference numerals. Thus, for example, the leadframe 300 includes the signal leads 102, the frame paddle 106, and the die 108 mounted on the frame paddle 106. However, rather than a surrounding bonding ring, the leadframe 300 has a ground plane structure comprising grounding tabs 302 extending laterally away from the frame paddle 106. The grounding tabs 302 are positioned in the intermediate layer level by upsets 304 that connect the grounding tabs 302 to the frame paddle 106.

The leadframe 300 also includes ground leads 306 that are similar to the ground leads 110 (FIG. 1) in the leadframe 100 (FIG. 1). However, unlike the ground leads 110, the ground leads 306 are connected directly to the frame paddle 106 by deep downsets 308. The deep downsets 308 are considered "deep" because they traverse the height of more than one layer or plane of the leadframe, in this case extending directly from the top signal leads layer to the bottom frame paddle layer.

A typical metal forming operation for a leadframe such as the leadframe 300 will involve, for example, mechanically pushing the frame paddle 106 down through two layer levels and mechanically pushing the grounding tabs 302 up one level in the reverse direction, into the final three layer configuration. To release the forces and residual stresses from such a metal forming operation, the leadframe 300 includes Z-links 310 and box slots 312. The box slots 312, which have an open center or slot 314, are positioned on the ends of the ground leads 306 nearest the deep downsets 308, connecting them together. The Z-links 310 are positioned on each end of each grounding tab 302, connecting the grounding tabs 302 to the upsets 304.

The Z-links 310 comprise a zigzag pattern of reduced transverse extent material, thereby being rendered more flexible. The dynamic effect is similar to that of the reduced transverse extent material that forms the open rings 116 (FIG. 1) and the material around the slots 118 (FIG. 1) in the leadframe 100 (FIG. 1). Being more flexible, the material in the Z-links 310 thus preferentially bends and deforms to absorb the residual forces from the metal formation processes that cut and shaped the leadframe 300, allowing the grounding tabs 302 to remain desirably flat and planar.

Similarly, the box slots 312 afford a connection having a lengthened linear extent of narrower transverse extent material that, as with the Z-links 310, provides a long path of more flexible material to absorb the residual forces and to provide stress relief from the metal formation processes that formed the leadframe 300.

Figure 4:
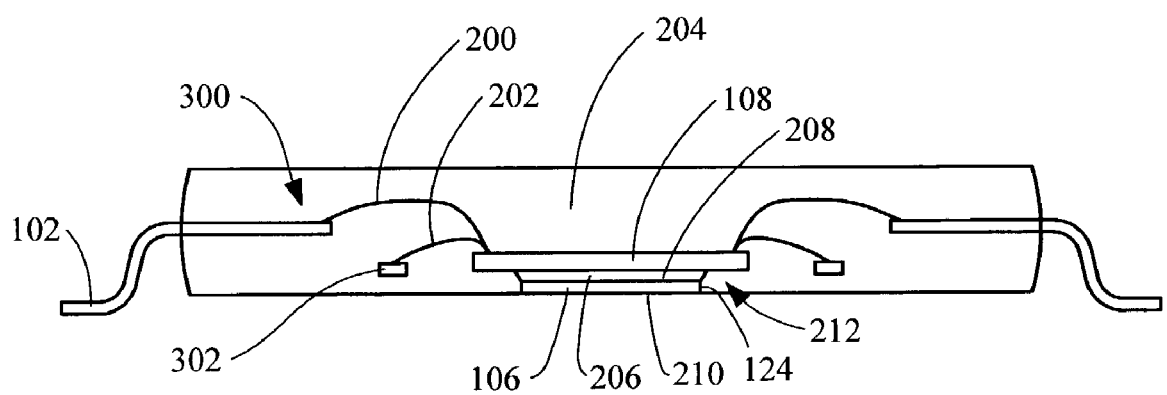
FIG. 4 is a cross-sectional view of the structure of FIG. 3 taken generally on line 4—4 of FIG. 3.

Referring now to FIG. 4, therein is shown a cross-sectional view of the structure of FIG. 3, taken generally on line 4—4 thereof. In addition, FIG. 4 illustrates the full extent of the signal leads 102, and shows the leadframe 300 in a final state of manufacture in which the signal wires 200 have been bonded to the signal leads 102 and connected to the die 108, the ground wires 202 have been bonded to the grounding tabs 302 and connected to the die 108, and the encapsulating body 204 has been formed therearound.

As can also be seen in FIG. 4, the dimensions of the frame paddle 106 are again much smaller than the die 108 that is mounted thereon. The smaller transverse extents of the frame paddle 106 thus significantly increase the moisture penetration path from outside the encapsulating body 204 to the top surface of the die 108, thereby substantially reducing damaging moisture penetration.

Figure 5:
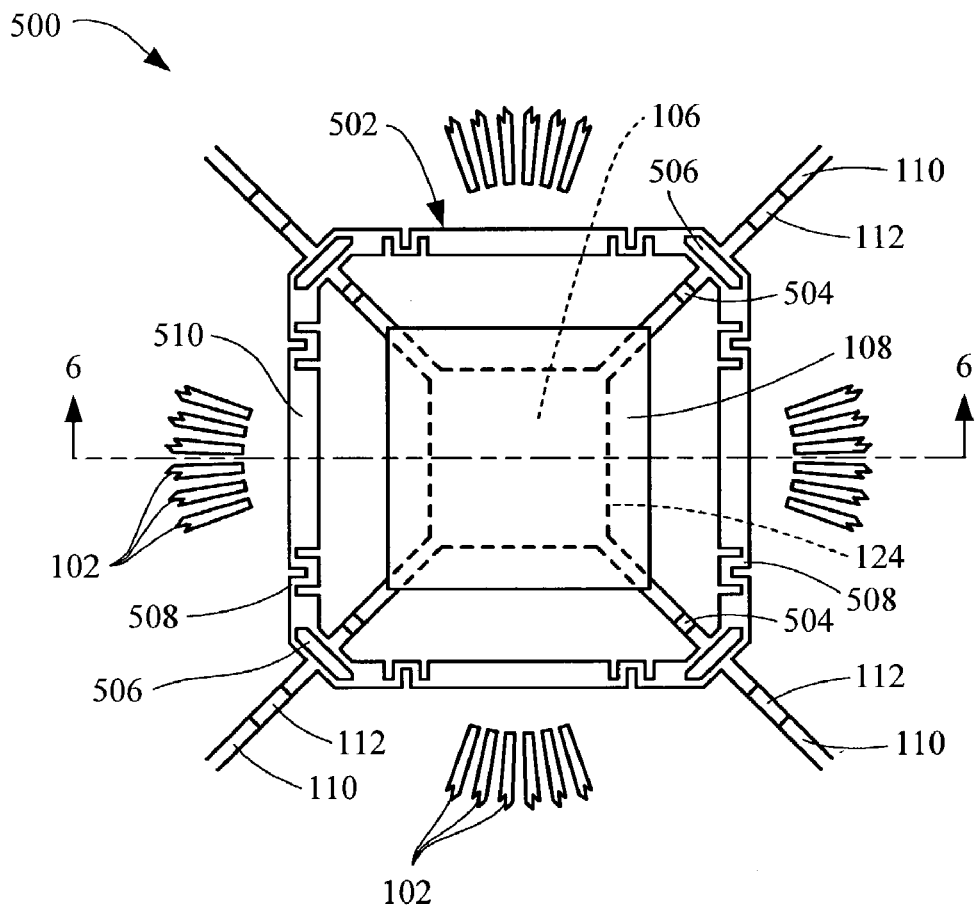
FIG. 5 is a plan view of an alternative leadframe configuration incorporating moisture ingress resistance features in accordance with the present invention.

Referring now to FIG. 5, therein is shown a leadframe 500 according to the present invention. The leadframe 500 is another configuration that incorporates force release and stress relief features into a multi-layer leadframe. In this configuration, the ground plane level structure is a bonding ring 502 connected to the ground leads 110 by the first downsets 112. In turn, the frame paddle 106 is connected to the bonding ring 502 by second downsets 504 connected at the corners of the frame paddle 106 and the bonding ring 502, rather than mid-length as illustrated for the second downsets 114 (FIG. 1) in the leadframe 100 (FIG. 1).

Residual force release and stress relief are then provided by corner slots 506 and W-links 508. The corner slots 506 function similarly as the box slots 312 (FIG. 3), and are located on the bonding ring 502 between the attachment points for the first downsets 112 and the second downsets 504. The W-links 508 function similarly as the Z-links 310 (FIG. 3) in the leadframe 300 (FIG. 3), and are located on the ends of the major extents 510 of the bonding ring 502. The major extents 510 of the bonding ring 502, as illustrated, are the portions of the bonding ring 502 that are intermediate the connections of the bonding ring 502 with the first downsets 112 and the second downsets 504.

Figure 6:
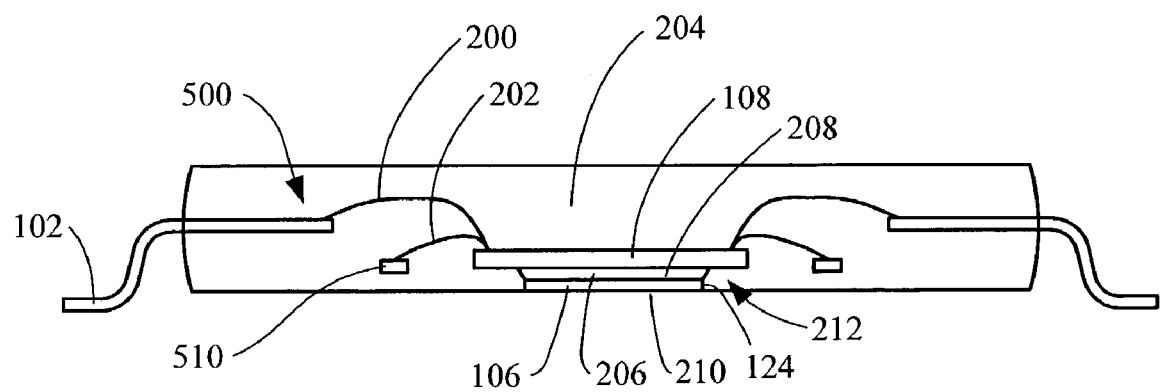
FIG. 6 is a cross-sectional view of the structure of FIG. 5 taken generally on line 6—6 of FIG. 5.

Referring now to FIG. 6, therein is shown a cross-sectional view of the structure of FIG. 5, taken generally on line 6—6 thereof. In addition, FIG. 6 illustrates the full extent of the signal leads 102, and shows the leadframe 500 in a final state of manufacture in which the signal wires 200 have been bonded to the signal leads 102 and connected to the die 108, the ground wires 202 have been bonded to the major extents 510 of the bonding ring 502 (FIG. 5) and connected to the die 108, and the encapsulating body 204 has been formed therearound.

As can also be seen in FIG. 6, the dimensions of the frame paddle 106 are again much smaller than the die 108 that is mounted thereon. The smaller transverse extents of the frame paddle 106 thus significantly increase the moisture penetration path from outside the encapsulating body 204 to the top surface of the die 108, thereby substantially reducing damaging moisture penetration.

Figure 7:
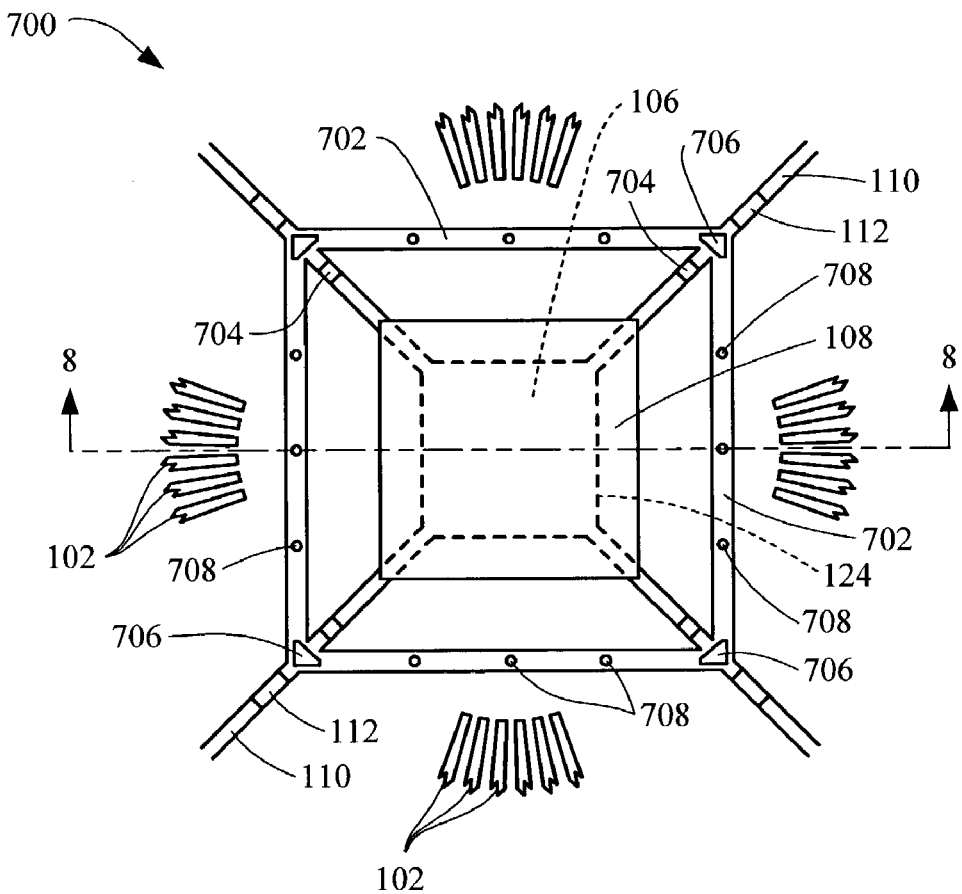
FIG. 7 is a plan view of still another leadframe embodiment incorporating moisture ingress resistance features according to the present invention.

Referring now to FIG. 7, therein is shown a leadframe 700 illustrating still another leadframe embodiment incorporating force release and stress relief features according to the present invention. The leadframe 700 includes a bonding ring 702 connected by downsets 704 to the frame paddle 106. The force release and stress relief features of the leadframe 700 include corner D-ring openings 706 and bonding ring holes 708. The corner D-ring openings 706, being located in the corner regions where the downsets 112 and 704 are attached to the bonding ring 702, provide stress relief similarly as the corner slots 506 (FIG. 5) in the leadframe 500 (FIG. 5). The bonding ring holes 708 likewise provide stress relief similarly as the open rings 116 (FIG. 1) in the leadframe 100 (FIG. 1).

Figure 8:
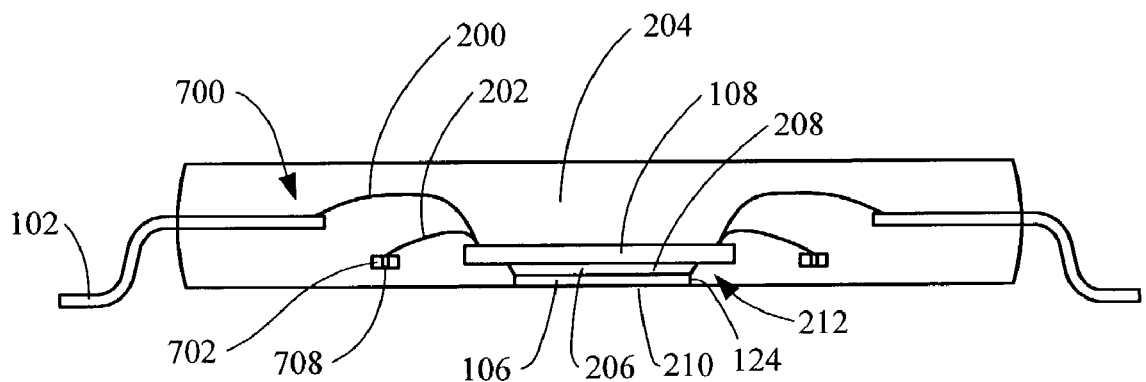
FIG. 8 is a cross-sectional view of the structure of FIG. 7 taken generally on line 8—8 of FIG. 7.

Referring now to FIG. 8, therein is shown a cross-sectional view of the structure of FIG. 7, taken generally on line 8—8 thereof. In addition, FIG. 8 illustrates the full extent of the signal leads 102, and shows the leadframe 700 in a final state of manufacture in which the signal wires 200 have been bonded to the signal leads 102 and connected to the die 108, the ground wires 202 have been bonded to the bonding ring 702 and connected to the die 108, and the encapsulating body 204 has been formed therearound.

As can also be seen in FIG. 8, the dimensions of the frame paddle 106 are again much smaller than the die 108 that is mounted thereon. The smaller transverse extents of the frame paddle 106 thus significantly increase the moisture penetration path from outside the encapsulating body 204 to the top surface of the die 108, thereby substantially reducing damaging moisture penetration.

Thus, it has been discovered that the integrated circuit leadframe with ground plane of the present invention furnishes important and heretofore unavailable solutions, capabilities, and functional advantages. Principally, the ground plane attachment rings and tabs of the present invention are freed from distortion and warpage resulting from residual mechanical stresses imposed by the downsetting and upsetting manufacturing steps, and the associated mechanical pushing of the various leadframe components to different levels, during multi-plane leadframe fabrication.

Another principle feature and advantage of the present invention is its increased moisture penetration resistance. This results in improved package integrity, longer device service life, and greater service reliability.

Still another feature and advantage is the reduced frame paddle size. Since the die is allowed to extend beyond the dimensions of the frame paddle, it is not necessary to match the die and frame paddle sizes. Thus, a single leadframe configuration can accommodate a large range of die sizes, resulting in greater versatility and increased cost savings.

The resulting leadframe configurations are straightforward, economical, uncomplicated, highly versatile and effective, and are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth herein or shown in the accompanying drawings are to be interpreted in an illustrative and non-limiting sense.

The invention claimed is:

1. A leadframe for a semiconductor die, comprising:
   signal leads;
   ground leads;
   a die support holder for supporting the semiconductor die, the die support holder having opposite surfaces and side edges therebetween, the opposite die support holder surfaces being smaller in transverse extent than the semiconductor die for supporting the die on one of the opposite die supporting holder surfaces such that the die extends beyond the side edges of the die support holder; and
   a ground plane bonding structure supported at a predetermined position relative to the die support holder.

2. The leadframe of claim 1 further comprising a force release and stress relief structure formed in the ground plane bonding structure to free the ground plane bonding structure substantially from distortion and warpage resulting from residual mechanical stresses therein.

3. The leadframe of claim 2 wherein the force release and stress relief structure further comprises at least one corner D-ring opening formed in the ground plane bonding structure.

4. The leadframe of claim 2 wherein the force release and stress relief structure further comprises at least one bonding ring hole formed in the ground plane bonding structure.

5. A leadframe for a semiconductor die, comprising:
   signal and ground leads;
   a ground plane connected to a plurality of the ground leads;
   a frame paddle for supporting the semiconductor die, the frame paddle having opposite surfaces and side edges therebetween, the opposite frame paddle surfaces being smaller in transverse extent than the semiconductor die for supporting the die on one of the opposite frame paddle surfaces such that the die extends beyond the side edges of the frame paddle; and
   supports connecting the signal and ground leads, ground plane, and frame paddle in at least three different layers.

6. The leadframe of claim 5 wherein the ground plane further comprises a ground plane bonding ring.

7. The leadframe of claim 6 further comprising force release and stress relief structures incorporated into the ground plane bonding ring to free the ground plane bonding ring substantially from distortion and warpage resulting from residual mechanical stresses therein.

8. The leadframe of claim 7 wherein the force release and stress relief structures further comprise corner D-ring openings formed in the ground plane bonding ring.

9. The leadframe of claim 7 wherein the force release and stress relief structures further comprise bonding ring holes formed in the ground plane bonding ring.

10. A semiconductor package, comprising:
    a semiconductor die;
    a leadframe having a die support holder having opposite surfaces and side edges therebetween, the opposite die support holder surfaces being smaller in transverse extent than the semiconductor die, and the die being supported on one of the opposite die support holder surfaces and extending beyond the side edges of the die support holder;
    an encapsulating body formed substantially around at least the semiconductor die and the die support holder surface on which the die is located, the encapsulating body being formed to leave the opposite die support holder surface unencapsulated; and signal leads, ground leads, and a ground plane bonding structure supported at predetermined positions relative to the die support holder.

11. The package of claim 10 further comprising a force release and stress relief structure formed in the ground plane bonding structure to free the ground plane bonding structure substantially from distortion and warpage resulting from residual mechanical stresses therein.

12. The package of claim 11 wherein the force release and stress relief structure further comprises at least one corner D-ring opening formed in the ground plane bonding structure.

13. The package of claim 11 wherein the force release and stress relief structure further comprises at least one bonding ring hole formed in the ground plane bonding structure.

14. A semiconductor package, comprising:
   a semiconductor die;
   a leadframe having:
      signal and ground leads;
      a ground plane connected to a plurality of the ground leads;
   a frame paddle having opposite surfaces and side edges therebetween, the opposite frame paddle surfaces being smaller in transverse extent than the semiconductor die, and the die being supported on one of the opposite frame paddle surfaces and extending beyond the side edges or the frame paddle; and
      supports connecting the signal and ground leads, ground plane, and frame paddle in at least three different layers;
   an adhesive securing the semiconductor die to the frame paddle;
   at least one ground wire connected between the semiconductor die and the ground plane;
   at least one signal wire connected between the semiconductor die and at least one of the signal leads; and
   an encapsulating body formed substantially around the leadframe, wires, semiconductor die, and the frame paddle surface on which the die is located, the encapsulating body being formed to leave the opposite frame paddle surface unencapsulated.

15. The package of claim 14 wherein the ground plane further comprises a ground paddle bonding ring.

16. The package of claim 15 further comprising force release and stress relief structures incorporated into the ground plane bonding ring to free the ground plane bonding ring substantially from distortion and warpage resulting from residual mechanical stresses therein.

17. The package at claim 16 wherein the force release and stress relief structures further comprise D-ring openings formed in the ground plane bonding ring.

18. The package of claim 16 wherein the force release and stress relief structures further comprising bonding ring holes formed in the ground plane bonding ring.

* * * * *

UNITED STATES PATENT AND TRADEMARK OFFICE
CERTIFICATE OF CORRECTION

PATENT NO. : 7,135,760 B2 Page 1 of 1
APPLICATION NO. : 10/446275
DATED : November 14, 2006
INVENTOR(S) : Han et al.

It is certified that error appears in the above-identified patent and that said Letters Patent is hereby corrected as shown below:

Column 9
    Claim 14, line 19, delete "or" and insert therefor --of--
Column 10
    Claim 15, line 11, delete "paddle" and insert therefor --plane--
    Claim 17, line 17, delete "at" and insert therefor --of--
    Claim 17, line 18, between "comprise" and "D-ring" insert therefor --corner--
    Claim 18, line 21, delete "comprising" and insert therefor --comprise--

Signed and Sealed this

Ninth Day of January, 2007

JON W. DUDAS
*Director of the United States Patent and Trademark Office*